United States Patent
Sebastiano

(10) Patent No.: US 9,614,519 B2
(45) Date of Patent: Apr. 4, 2017

(54) DRIVER FOR SWITCHED CAPACITOR CIRCUITS

(71) Applicant: NXP B.V., Eindhoven (NL)

(72) Inventor: Fabio Sebastiano, Rotterdam (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/729,341

(22) Filed: Jun. 3, 2015

(65) Prior Publication Data

US 2015/0381165 A1 Dec. 31, 2015

(30) Foreign Application Priority Data

Jun. 30, 2014 (EP) .................................... 14175054

(51) Int. Cl.
| | |
|---|---|
| H03K 3/00 | (2006.01) |
| H03K 17/56 | (2006.01) |
| G11C 27/02 | (2006.01) |
| H03F 3/00 | (2006.01) |

(52) U.S. Cl.
CPC ........... *H03K 17/56* (2013.01); *G11C 27/026* (2013.01); *H03F 3/005* (2013.01); *H03F 2200/261* (2013.01)

(58) Field of Classification Search
USPC ........................................................ 327/111
See application file for complete search history.

(56) References Cited

U.S. PATENT DOCUMENTS

| | | | | |
|---|---|---|---|---|
| 4,365,204 A | * | 12/1982 | Haque | ..................... H03F 3/005 |
| | | | | 327/337 |
| 5,132,552 A | * | 7/1992 | Ito | ............................ G06G 7/30 |
| | | | | 327/100 |
| 2012/0182071 A1 | | 7/2012 | Takei | |
| 2013/0162455 A1 | * | 6/2013 | Mateman | ............. G11C 27/026 |
| | | | | 341/122 |

FOREIGN PATENT DOCUMENTS

EP   0 047 409 A2   3/1982

OTHER PUBLICATIONS

Enz, C.C. et al. "Circuit Techniques for Reducing the Effects of Op-Amp Imperfections: Autozeroing, Correlated Double Sampling, and Chopper Stabilization", Proceedings of the IEEE, vol. 84, No. 11, pp. 1584-1614 (Nov. 1996).

(Continued)

*Primary Examiner* — Lincoln Donovan
*Assistant Examiner* — Patrick Chen
(74) *Attorney, Agent, or Firm* — Rajeev Madnawat

(57) ABSTRACT

There is described a driver for a switched capacitor circuit (230, 330), the driver comprising (a) a voltage amplifier (210, 310) comprising a signal input (212, 312), a feedback input (214, 314) and an amplifier output (216, 316), and (b) a feedback network (220) coupled between the amplifier output (216, 316) and the feedback input (214, 314). The feedback network comprises a track-and-hold circuit (222) adapted to mask a voltage dip occurring at the amplifier output (216, 316) at the beginning of a switched capacitor circuit charging phase. There is also described a switched capacitor circuit comprising such a driver, a sensor device, and a method of driving a switched capacitor circuit.

15 Claims, 1 Drawing Sheet

(56) References Cited

OTHER PUBLICATIONS

Fan, Q et al. "A 21 nV/√Hz Chopper-Stabilized Multi-Path Current-Feedback Instrumentation Amplifier With 2μV Offset", IEEE J. of Solid-State Circuits, vol. 47, No. 2, pp. 464-475 (Feb. 2012).
Analog and Mixed-Signal Center, TAMU, "ECEN 607 (ESS), Track & Hold Architectures and Circuits, Non-Ideal Switches", 34 pgs.
Extended European Search Report for EP Patent Appln. No. 14175054.7 (Oct. 7, 2014).

* cited by examiner

DRIVER FOR SWITCHED CAPACITOR CIRCUITS

CROSS-REFERENCE TO RELATED APPLICATIONS

This application claims the priority under 35 U.S.C. §119 of European patent application no. 14175054.7, filed on Jun. 30, 2014, the contents of which are incorporated by reference herein.

FIELD OF THE INVENTION

The present invention relates to the field of switched capacitor circuits, in particular to a driver for a switched capacitor circuit, a switched capacitor circuit comprising such driver, a sensor device, and a method of driving a switched capacitor circuit.

ART BACKGROUND

Switched capacitor (SC) circuits are used to implement several signal-processing functions, ranging from filters to analog-to-digital converters. The input stage of a SC circuit can be modelled as a capacitor $C_L$ that must be charged at every clock cycle. Since the equivalent input impedance of a SC circuit may be low (due to large capacitance $C_L$ and/or high clock frequency), a driver is needed to isolate the signal source from the SC circuit. The driver is a continuous-time circuit that charges the input capacitor $C_L$ to a voltage level proportional to the input signal. Since the information in a SC circuit is represented by the charge on the internal capacitor, the driver must ensure that the voltage on the input capacitance $C_L$ has properly settled at the end of the charging phase.

A typical SC driver uses an amplifier in feedback configuration to charge the capacitor $C_L$ during the charging phase. If the output impedance of the amplifier and the resistance of the switch that is driven by the charge phase control signal are low enough, the charging transient is fast and the input voltage will be copied accurately on the capacitor $C_L$. However, if the output impedance of the amplifier (or the aforementioned switch resistance) is not low enough, a charging transient occurs. In this case, if the bandwidth of amplifier and feedback network are wide, the voltage on the capacitor settles to the proper value at the end of the transient.

Implementing an amplifier with low output impedance entails significant costs. Reducing the output impedance of the amplifier requires increasing the power and the dimension of the output devices of the amplifier. To counteract the effect of the high output impedance, a wide-bandwidth amplifier may be used. However, this would also lead to an increase in the power consumption of the amplifier. Moreover, if there are stringent requirements on the input-referred offset of the driver, the amplifier must have a low intrinsic offset or be offset-compensated. In the first case, the amplifier will require a large area to obtain a good matching of its input device and, consequently, a low input offset. In the latter case, it must be implemented using offset-compensation techniques, such as chopping or auto-zeroing. However, it is well-known that such techniques limit the bandwidth of amplifiers (cf. Enz, C. C., Temes, G. C., "Circuit techniques for reducing the effects of op-amp imperfections: autozeroing, correlated double sampling, and chopper stabilization," *Proceedings of the IEEE*, vol. 84, no. 11, pp. 1584, 1614, November 1996). This can be avoided only at the expense of increased circuit complexity (cf. Qinwen Fan; Huijsing, J. H.; Makinwa, K. A A, "A 21 nV/√Hz Chopper-Stabilized Multi-Path Current-Feedback Instrumentation Amplifier With 2 μV Offset," *Solid-State Circuits, IEEE Journal of*, vol. 47, no. 2, pp. 464, 475, February 2012). Accordingly, there may be a need for a driver for switched capacitor circuits, which is capable of driving the switched capacitor circuit properly without the need for an amplifier with large bandwidth and/or low output impedance.

SUMMARY OF THE INVENTION

This need may be met by the subject matter according to the independent claims. Advantageous embodiments of the present invention are set forth in the dependent claims.

According to a first aspect, there is provided a driver for a switched capacitor circuit, the driver comprising (a) a voltage amplifier comprising a signal input, a feedback input and an amplifier output, and (b) a feedback network coupled between the amplifier output and the feedback input, wherein (c) the feedback network comprises a track and hold circuit adapted to mask a voltage dip occurring at the amplifier output at the beginning of a switched capacitor circuit charging phase.

This aspect is based on the idea that the voltage dip occurring at the beginning of the charging phase (where the substantially discharged capacitor of the switched capacitor circuit is connected to the amplifier output and therefore draws the voltage at the amplifier output down) is masked by a track and hold circuit such that the voltage dip is not (or only insignificantly) fed back to the feedback input through the feedback network. Thereby, the amplifier and feedback network do not need to have a wide bandwidth, and it is not essential that the amplifier has very low output impedance. Accordingly, the driver according to this aspect can be implemented with relatively simple, compact and low-power amplifier and feedback network. Thus, the driver can be implemented at low cost and with a relatively small footprint.

In the present context, the term "track and hold circuit" may particularly denote a circuit that is adapted to track a particular voltage during a tracking phase in the sense that the circuit outputs a voltage that follows the particular voltage. During a hold phase, the circuit outputs a constant voltage that is equal to the last value of the particular voltage prior to beginning of the hold phase.

The track and hold circuit may be arranged anywhere in the feedback path between the amplifier output and the feedback input. In particular, the track and hold circuit may be arranged between the amplifier output and the remaining feedback network, between the feedback input and the remaining feedback network, or integrated within the feedback network.

The voltage amplifier may preferably be implemented as an operational amplifier.

The feedback network may comprise one or more passive components, such as resistors, capacitors, etc. configured to attenuate and/or filter the signal at the amplifier output on the way to the feedback input of the amplifier.

Summarizing the above, the driver according to the first aspect provides savings with regard to area, power and circuit complexity in comparison to known drivers for switched capacitor circuits.

According to an embodiment, the track and hold circuit is adapted to cause the feedback network to supply a voltage corresponding to the amplifier output voltage to the feedback input during a tracking phase. Furthermore, the track and hold circuit is adapted to cause the feedback network to supply a substantially constant voltage to the feedback input during a hold phase, the constant voltage corresponding to the amplifier output voltage at the end of the preceding tracking phase.

In other words, the track and hold circuit functions such that, during the tracking phase, the feedback input receives a voltage corresponding to the actual voltage at the amplifier output, i.e. a voltage derived (attenuated and or filtered) from the actual output voltage. During the hold phase, the track and hold circuit functions such that changes in the voltage at the amplifier output are not reflected at the feedback input. Instead, the feedback input receives a substantially constant voltage corresponding to the last output voltage prior to begin of the hold phase.

Accordingly, a voltage dip (i.e. a sudden voltage drop) at the amplifier output occurring during the hold phase will not result in a corresponding change at the feedback input.

According to a further embodiment, the track and hold circuit is adapted to begin the hold phase synchronously with the beginning of the switched capacitor circuit charging phase. Furthermore, the track and hold circuit is adapted to begin the tracking phase after a predetermined fraction of the switched capacitor circuit charging phase has passed.

By beginning the hold phase at the same time as the switched capacitor circuit charging phase begins, it is assured that a voltage dip (or voltage drop) occurring at the amplifier output at the beginning of the charging phase does not result in a corresponding change in the voltage at the feedback input. Then, after a predetermined fraction of the charging phase has passed, i.e. when the voltage at the amplifier output has substantially recovered from the aforementioned voltage dip, the track and hold circuit switches to the tracking phase and thus opens the feedback path such that the voltage at the feedback input depends directly on the actual voltage that is present at the amplifier output.

According to a further embodiment, the predetermined fraction of the switched capacitor circuit charging phase is between 5% and 95% of the switched capacitor circuit charging phase, such as between 10% and 90% of the switched capacitor circuit charging phase, such as between 15% and 85% of the switched capacitor circuit charging phase, such as between 20% and 80% of the switched capacitor circuit charging phase, such as between 25% and 75% of the switched capacitor circuit charging phase, such as between 30% and 70% of the switched capacitor circuit charging phase, such as between 35% and 65% of the switched capacitor circuit charging phase, such as between 40% and 60% of the switched capacitor circuit charging phase, such as between 45% and 55% of the switched capacitor circuit charging phase, such as around 50% of the switched capacitor circuit charging phase.

Thereby, a tradeoff is achieved in the sense that the significant part of the voltage dip occurring at the amplifier output at the beginning of the charging phase is masked by the track and hold circuit, while the actual voltage at the amplifier output is let through to the feedback input during the remaining part of the charging phase (and during the following discharging phase) such that the amplifier is allowed to react correspondingly.

According to a further embodiment, the track and hold circuit comprises a capacitor and a switch, the capacitor being coupled to receive a voltage corresponding to the amplifier output voltage when the switch is closed during the tracking phase, and to maintain a voltage at the feedback input corresponding to the amplifier output voltage at the end of the preceding tracking phase when the switch is open during the hold phase.

In other words, the voltage on the capacitor follows the amplifier output voltage during the tracking phase and maintains the voltage from the end of the tracking phase during the hold phase.

According to a second aspect, there is provided a switched capacitor circuit comprising (a) a driver circuit according to the first aspect or any of the embodiments described above, (b) a charging capacitor, (c) a first switch coupled between the amplifier output and the charging capacitor for controlling charging of the charging capacitor, and (d) a second switch for controlling discharging of the charging capacitor.

This aspect is based on the same idea as the first aspect described above and constitutes a switched capacitor circuit comprising a driver according to the first aspect.

The charging and discharging of the charging capacitor is controlled by the first and second switches as known in the art.

According to an embodiment, the switched capacitor circuit further comprises a control unit adapted to (a) close the first switch and open the second switch during the switched capacitor circuit charging phase, (b) open the first switch and close the second switch during a switched capacitor circuit discharging phase, and (c) control the track-and-hold circuit such that a hold phase is initiated synchronously with the beginning of the switched capacitor circuit charging phase and such that a tracking phase is initiated after a predetermined fraction of the switched capacitor circuit charging phase has passed.

The control unit may in particular be adapted to generate control signals for each of the first and second switches as well as for the track and hold circuit based on a clock signal of the switched capacitor circuit.

According to a third aspect, there is provided a sensor device comprising (a) a switched capacitor circuit according to the second aspect or any of the above embodiments, and (b) a sensor unit coupled to the signal input of the voltage amplifier.

This aspect is essentially based on the same idea as the first aspect. More specifically, the third aspect constitutes a use of the first aspect in a sensor device.

The sensor device may in particular be a sensor device for automotive applications (such as an angular sensor, a speed sensors, etc.) or a sensor device for consumer applications (such as temperature sensors, humidity sensors, gas sensors, etc.).

According to a fourth aspect, there is provided a method of driving a switched capacitor circuit by means of a driver circuit, the driver circuit comprising a voltage amplifier having a signal input, a feedback input and an amplifier output, and a feedback network coupled between the amplifier output and the feedback input a track and hold circuit. The method comprises (a) operating the track and hold circuit to mask a voltage dip occurring at the amplifier output at the beginning of a switched capacitor circuit charging phase.

This aspect is essentially based on the same idea as the previous aspects.

It should be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless otherwise indicated, in addition to any combination of features belonging to one type of subject matter also any combination of features relating to different subject matters, in particular a combination of features of the method type claims and features of the apparatus type claims, is also disclosed with this document.

The aspects defined above and further aspects of the present invention will be apparent from the examples of embodiment to be described hereinafter and are explained with reference to the examples of embodiment. The invention will be described in more detail hereinafter with reference to examples of embodiment to which the invention is, however, not limited.

DETAILED DESCRIPTION

Figure 1:
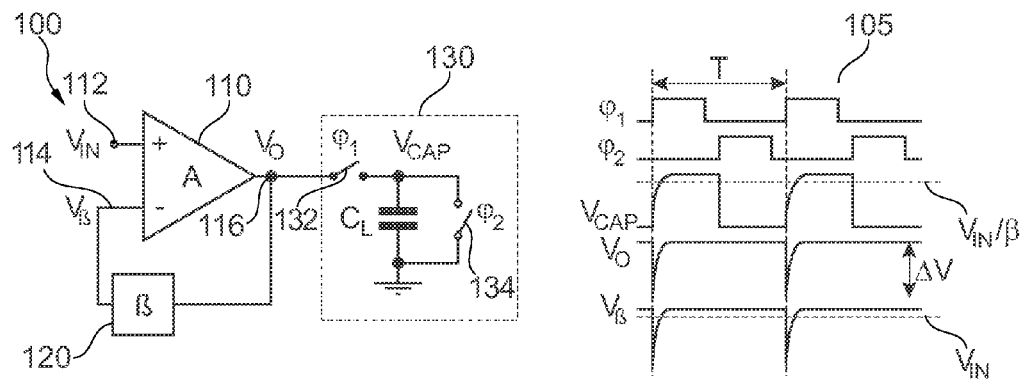
FIG. 1 shows a conventional driver for a switched capacitor circuit and a corresponding timing diagram.

The illustration in the drawing is schematic. It is noted that in different figures, similar or identical elements are provided with the same reference signs or with reference signs, which differ only within the first digit.

FIG. 1 shows a conventional driver 100 for a switched capacitor circuit 130 and a corresponding timing diagram 105. The conventional driver 100 comprises an amplifier 110 having a signal input 112, a feedback input 114 and an amplifier output 116. A feedback network 120 is coupled between the amplifier output 116 and the feedback input 114. The switched capacitor circuit 130 comprises a charging capacitor $C_L$, a first switch 132, and a second switch 134. The first switch 132 is arranged between the amplifier output 116 and the charging capacitor $C_L$ to control charging of the capacitor $C_L$. The second switch 134 is arranged to control discharging of the charging capacitor $C_L$ to a relevant part of the switched capacitor circuit (not shown). Thus, the second switch 134 is a schematic representation of the "discharging part" of the switched capacitor circuit 130. More specifically, the first switch 132 is controlled by the periodic signal $\phi_1$ shown in the timing diagram 105, and the second switch 134 is controlled by the periodic signal $\phi_2$ also shown in the timing diagram 105. The switches 132 and 134 are closed when the corresponding control signals $\phi_1$ and $\phi_2$ are high and open when the corresponding control signals $\phi_1$ and $\phi_2$ are low. It is noted that the switched capacitor circuit 130 shown in FIG. 1 (and in the following FIGS. 2 and 3) is a simplified model. Thus, the following discussions and detailed descriptions apply to all kinds of switched capacitor circuits that present a capacitor to charge at each clock cycle.

If the amplifier 110 of the driver 100 has non-negligible output impedance, the output voltage $V_O$ will drop at the beginning of the charging phase (i.e. when $\phi_1$ goes high). Since the bandwidth of the amplifier 110 and of the feedback network 120 are finite, a finite time is required for the output voltage $V_O$ and, consequently, for the voltage $V_{CAP}$ on the charging capacitor $C_L$ to settle. The feedback network 120 is designed such that, within the bandwidth of the feedback system, $V_{IN} \approx V_\beta$ (i.e. the voltages at the signal input 112 is substantially equal to the voltage at the feedback input 114). Thus, if the attenuation factor of the feedback network 120 is $\beta$, the voltage $V_O$ at the amplifier output 116 is consequently approximately equal to $V_{IN}/\beta$, i.e. $V_O \approx V_{IN}/\beta$. However, if the bandwidth of the amplifier 110 with feedback network 120 is lower than the bandwidth of the signal at the amplifier output 116, some spectral components will be ignored by the feedback system, resulting in an error. For example, if the bandwidth of the feedback is much lower than the clock frequency (1/T), the feedback will only make sure that the average of the output voltage $V_O$ is equal to the input voltage $V_{IN}$. Since the average of $V_O$ is lower than the value of $V_O$ at the end of the settling time because of the transient (see the example in FIG. 1a), the voltage $V_{CAP}$ at the end of the charging phase (i.e. when $\phi_1$ goes low) will be higher than $V_{IN}/\beta$.

Note that in this description, the input signal is assumed to be DC. However, this is done only for ease of explanation. The same reasoning applies to time-varying signals.

To quantify the error introduced by the finite bandwidth of the amplifier 110 and the feedback network 120, it is assumed that the feedback network 120 has a wide bandwidth and that the amplifier 110 has a bandwidth much lower than the clock frequency of the switched capacitor circuit (i.e. 1/T).

Assuming that the output impedance of the amplifier 110 is purely resistive and equal to $R_O$ and that the parasitic capacitance at the output node 116 is negligible, the output voltage $V_O$ will drop to ground at the beginning of the charging phase as shown in the timing diagram 105. Under the assumption of a low bandwidth of amplifier 110, the transient can be approximated by an exponential settling with time constant $\tau = R_O C_L$. For $\tau \ll T$, the average value of $V_O$ can then be computed as:

$$\langle V_0 \rangle = \frac{1}{T} \int_0^T V_0(t) dt \cong$$
$$\frac{1}{T} \int_0^T \Delta V (1 - e^{-t/\tau}) dt = \Delta V \left[ 1 - \frac{\tau}{T} (1 - e^{-T/\tau}) \right] \cong \Delta V \left( 1 - \frac{\tau}{T} \right)$$

where $\Delta V$ is the voltage on the capacitor $C_L$ at the end of the settling (i.e. towards the end of the charging period). In the previous expression, the approximation was used that the time constant $\tau$ does not change in the charging and discharging phases. Furthermore, the effect of the bandwidth of the amplifier has been neglected. These approximations hold if $\tau \ll T$ and if $B \ll 1/T$, where B is the bandwidth of the amplifier 110.

Since $\langle V_O \rangle \beta = V_{IN}$, the relative error on the output voltage at the end of the charging phase is equal to $$\text{error}_{relative} = \frac{\Delta V - \frac{V_{IN}}{\beta}}{\frac{V_{IN}}{\beta}} = \frac{\frac{\tau}{T}}{1 - \frac{\tau}{T}} \cong \frac{\tau}{T} = \frac{R_O C_L}{T}$$

Considering typical values for the above parameters $$\left( R_0 = 1 \text{ k}\Omega, C_L = 1 \text{ pF}, \frac{1}{T} = 10 \text{ MHz} \right),$$

the relative error can easily be in the order of 1%. Moreover, this error is not constant but it strongly dependent on variation of the parameters in the equation above. For instance, the output impedance can have very large variations over temperature and process corners.

Figure 2:
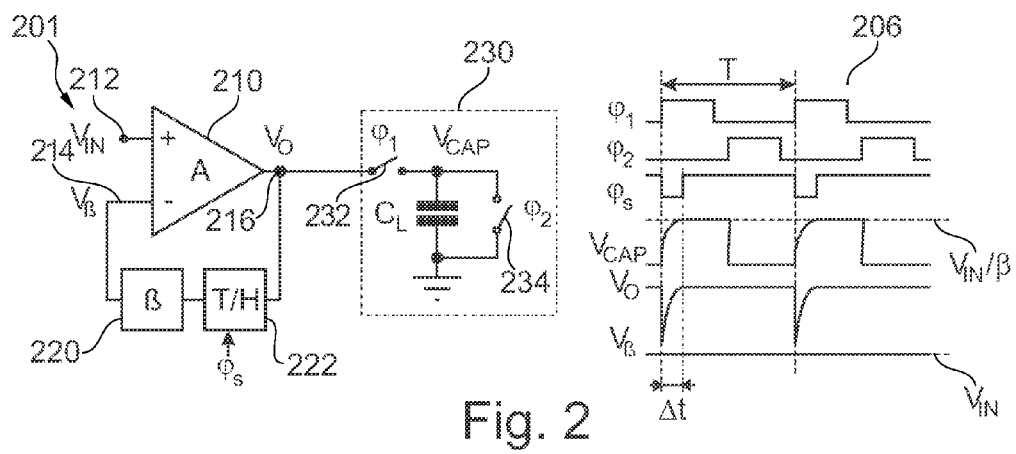
FIG. 2 shows a driver for a switched capacitor circuit in accordance with an embodiment and a corresponding timing diagram.

FIG. 2 shows a driver 201 for a switched capacitor circuit 230 in accordance with an embodiment and a corresponding timing diagram 206. The driver circuit 201 differs from the conventional driver circuit 100 discussed above in that a track and hold circuit 222 is added in series with the feedback network 220. More specifically, the track and hold circuit 222 shown in FIG. 2 is controlled by control signal $\phi_S$ and functions such that it delivers an output voltage to the feedback network 220 that is equal to its input (i.e. the voltage $V_O$ at the amplifier output 216) when $\phi_S$ is high, whereas it holds the last value of the output voltage $V_O$ when $\phi_S$ is low. As shown in the timing diagram 206, the control signal $\phi_S$ is designed to go low at the beginning of the charging phase (i.e. when $\phi_1$ goes high) and to go high after a predetermined fraction of the charging phase has passed, i.e. after $\Delta t$ as shown in the timing diagram 206. Thereby, the transient due to the charge of the capacitor $C_L$ is masked such that the feedback network 220 only receives the voltage $V_{CAP}$ on top of the capacitor $C_L$ when said voltage $V_{CAP}$ is near to the final settling value. In this way, the voltage $V_\beta$ at the feedback input 214 of amplifier 210 is a low-frequency signal (a DC signal in the explanatory example of FIG. 2) equal to the voltage $V_O$ at the amplifier output 216 at the end of the settling). Since the feedback network 220 ensures that $V_{IN} \approx V_\beta$, at the end of the settling $V_O \approx V_{IN}/\beta$ as desired.

Figure 3:
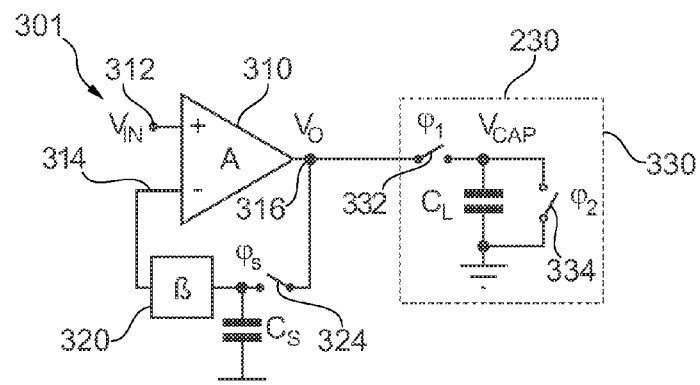
FIG. 3 shows a driver for a switched capacitor circuit in accordance with a further embodiment.

FIG. 3 shows a driver 301 for a switched capacitor circuit 330 in accordance with a further embodiment. In this embodiment, the track and hold circuit 222 is implemented as a capacitor $C_S$ and a switch 324. Otherwise, the driver 301 is identical to the driver 201 discussed above in conjunction with FIG. 2. More specifically, the switch 324 is controlled by the control signal $\phi_S$ shown in the timing diagram 206 of FIG. 2. Thus, the switch 324 opens when the control signal $\phi_S$ goes low at the beginning of the charging phase and closes after a period of $\Delta t$ when the control signal $\phi_S$ goes high again. While the switch is open, the capacitor $C_S$ holds a voltage corresponding to the voltage $V_O$ at the amplifier output 316 just before the switch 324 was opened. When the switch 324 is closed, the voltage on the capacitor $C_S$ follows the voltage $V_O$ at the amplifier output 316. Thereby, the voltage at the feedback input 314 of the amplifier 310 is not (or only insignificantly) influenced by the dip in the voltage $V_O$ at the amplifier output 316 occurring at the beginning of the charging phase.

It is noted that although the embodiments shown in FIGS. 2 and 3 are single-ended systems, the principles and teachings of the present invention may also be used in differential systems, e.g. in a sensor application where a sensor unit provides a differential output.

It is noted that, unless otherwise indicated, the use of terms such as "upper", "lower", "left", and "right" refers solely to the orientation of the corresponding drawing.

It is noted that the term "comprising" does not exclude other elements or steps and that the use of the articles "a" or "an" does not exclude a plurality. Also elements described in association with different embodiments may be combined. It should also be noted that reference signs in the claims should not be construed as limiting the scope of the claims.

The invention claimed is:

1. A switched capacitor circuit comprising
a driver circuit, the driver circuit comprising,
a voltage amplifier comprising a signal input that receives an input voltage from a signal source, a feedback input, and an amplifier output that outputs an output voltage to drive a switched capacitor circuit; and
a feedback network coupled between the amplifier output and the feedback input such that a voltage at the feedback input is equal to a voltage at the amplifier output;
wherein the feedback network comprises a track-and-hold circuit adapted to mask a voltage dip occurring at the amplifier output at the beginning of a switched capacitor circuit charging phase,
a charging capacitor,
a first switch coupled between the amplifier output and the charging capacitor for controlling charging of the charging capacitor,
a second switch for controlling discharging of the charging capacitor, and
a control unit configured to:
close the first switch and open the second switch during the switched capacitor circuit charging phase,
open the first switch and close the second switch during a switched capacitor circuit discharging phase, and
control the track-and-hold circuit such that a hold phase is initiated synchronously with the beginning of the switched capacitor circuit charging phase and such that a tracking phase is initiated after a predetermined fraction of the switched capacitor circuit charging phase has passed.

2. The switched capacitor circuit according to claim 1, wherein the track and hold circuit is adapted to cause the feedback network to supply a voltage corresponding to the amplifier output voltage to the feedback input during a tracking phase, and wherein the track and hold circuit is adapted to cause the feedback network to supply a constant voltage to the feedback input during a hold phase, the constant voltage corresponding to the amplifier output voltage at the end of the preceding tracking phase.

3. The switched capacitor circuit according to claim 1, wherein the track and hold circuit is adapted to begin a hold phase synchronously with the beginning of the switched capacitor circuit charging phase, and wherein the track and hold circuit is adapted to begin a tracking phase after a predetermined fraction of the switched capacitor circuit charging phase has passed.

4. The switched capacitor circuit according to claim 1, wherein a predetermined fraction of the switched capacitor circuit charging phase is between 5% and 95% of the switched capacitor circuit charging phase.

5. The switched capacitor circuit according to claim 2, wherein the track and hold circuit comprises a capacitor and a switch, the capacitor being coupled to receive a voltage corresponding to the amplifier output voltage when the switch is closed during the tracking phase, and to maintain a voltage at the feedback input corresponding to the amplifier output voltage at the end of the preceding tracking phase when the switch is open during the hold phase.

6. A sensor device comprising
a switched capacitor circuit, according to claim 1, and
a sensor unit coupled to the signal input of the voltage amplifier to provide the input voltage.

7. A method of driving a switched capacitor circuit using a driver circuit, the driver circuit comprising a voltage amplifier having a signal input that receives an input voltage from a signal source, a feedback input, and an amplifier output that outputs an output voltage to drive the switched capacitor circuit, and a feedback network coupled between the amplifier output and the feedback input such that a voltage at the feedback input is equal to a voltage at the amplifier output, wherein the feedback network includes a track and hold circuit, the method comprising:

operating the track and hold circuit to mask a voltage dip occurring at the amplifier output at the beginning of a switched capacitor circuit charging phase;

and further comprising;

a charging capacitor;

a first switch coupled between the amplifier output and the charging capacitor for controlling charging of the charging capacitor; and a second switch for controlling discharging of the charging capacitor;

the method further comprising:

closing the first switch and opening the second switch during the switched capacitor circuit charging phase;

opening the first switch and closing the second switch during a switched capacitor circuit discharging phase; and controlling the track-and-hold circuit such that a hold phase is initiated synchronously with the beginning of the switched capacitor circuit charging phase and such that a tracking phase is initiated after a predetermined fraction of the switched capacitor circuit charging phase has passed.

8. The method of claim 7 wherein operating the track and hold circuit comprises causing the feedback network to supply a voltage corresponding to the amplifier output voltage to the feedback input during a tracking phase, and causing the feedback network to supply a constant voltage to the feedback input during a hold phase, the constant voltage corresponding to the amplifier output voltage at the end of the preceding tracking phase.

9. The method of claim 8, further comprising beginning a hold phase synchronously with the beginning of the switched capacitor circuit charging phase, and beginning a tracking phase after a predetermined fraction of the switched capacitor circuit charging phase has passed.

10. A sensor device comprising
a switched capacitor circuit, having;
a driver circuit having;
a voltage amplifier comprising a signal input that receives an input voltage from a signal source, a feedback input, and an amplifier output that outputs an output voltage to drive a switched capacitor circuit; and
a feedback network coupled between the amplifier output and the feedback input such that a voltage at the feedback input is equal to a voltage at the amplifier output;
wherein the feedback network comprises a track-and-hold circuit adapted to mask a voltage dip occurring at the amplifier output at the beginning of a switched capacitor circuit charging phase
a charging capacitor,
a first switch coupled between the amplifier output and the charging capacitor for controlling charging of the charging capacitor, and
a second switch for controlling discharging of the charging capacitor
a sensor unit coupled to the signal input of the voltage amplifier to provide the input voltage.

11. The sensor device according to claim 10, wherein the track and hold circuit is adapted to cause the feedback network to supply a voltage corresponding to the amplifier output voltage to the feedback input during a tracking phase, and wherein the track and hold circuit is adapted to cause the feedback network to supply a constant voltage to the feedback input during a hold phase, the constant voltage corresponding to the amplifier output voltage at the end of the preceding tracking phase.

12. The sensor device according to claim 11, wherein the track and hold circuit comprises a capacitor and a switch, the capacitor being coupled to receive a voltage corresponding to the amplifier output voltage when the switch is closed during the tracking phase, and to maintain a voltage at the feedback input corresponding to the amplifier output voltage at the end of the preceding tracking phase when the switch is open during the hold phase.

13. The sensor device according to claim 10, wherein the track and hold circuit is adapted to begin a hold phase synchronously with the beginning of the switched capacitor circuit charging phase, and wherein the track and hold circuit is adapted to begin a tracking phase after a predetermined fraction of the switched capacitor circuit charging phase has passed.

14. The sensor device according to claim 10, wherein a predetermined fraction of the switched capacitor circuit charging phase is between 5% and 95% of the switched capacitor circuit charging phase.

15. The sensor device according to claim 10, wherein the switched capacitor circuit further comprises a control unit configured to
close the first switch and open the second switch during the switched capacitor circuit charging phase,
open the first switch and close the second switch during a switched capacitor circuit discharging phase, and
control the track-and-hold circuit such that a hold phase is initiated synchronously with the beginning of the switched capacitor circuit charging phase and such that a tracking phase is initiated after a predetermined fraction of the switched capacitor circuit charging phase has passed.

* * * * *